(12) United States Patent
Huang et al.

(10) Patent No.: US 10,498,349 B2
(45) Date of Patent: Dec. 3, 2019

(54) BIT ERROR RATE FORECAST CIRCUIT FOR SUCCESSIVE APPROXIMATION REGISTER ANALOG-TO-DIGITAL CONVERSION

(71) Applicant: REALTEK SEMICONDUCTOR CORPORATION, Hsinchu (TW)

(72) Inventors: Yu-Xuan Huang, Hsinchu County (TW); Liang-Huan Lei, Kaohsiung (TW); Shih-Hsiung Huang, Miaoli County (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/168,105

(22) Filed: Oct. 23, 2018

(65) Prior Publication Data

US 2019/0140654 A1    May 9, 2019

(30) Foreign Application Priority Data

Nov. 6, 2017   (TW) .............................. 106138324 A

(51) Int. Cl.
*H03M 1/10*  (2006.01)
*H03M 1/12*  (2006.01)
*H03M 1/46*  (2006.01)

(52) U.S. Cl.
CPC ......... *H03M 1/1071* (2013.01); *H03M 1/125* (2013.01); *H03M 1/468* (2013.01)

(58) Field of Classification Search
CPC ..... H03M 1/1071; H03M 1/125; H03M 1/468
(Continued)

(56) References Cited

U.S. PATENT DOCUMENTS 6,865,709 B2 *   3/2005  Dillinger ............. H03M 13/356
                                                 714/786
8,860,598 B2    10/2014  Thompson et al.
(Continued)

FOREIGN PATENT DOCUMENTS

TW         201731222        9/2017

OTHER PUBLICATIONS

Taiwan Intellectual Property Office, "Office Action", dated Jun. 11, 2018 OA letter of counterpart TW application(appl. No. 106138324) Summary of the TW OA letter: Claims 1-2 are rejected as being anticipated by the cited reference 1 (TW 201731222 A, also published as U.S. Pat. No. 9,923,568B2).
(Continued)

*Primary Examiner* — Lam T Mai
(74) *Attorney, Agent, or Firm* — WPAT, PC

(57) ABSTRACT

Disclosed is a bit error rate (BER) forecast circuit for successive approximation register analog-to-digital conversion. The BER forecast circuit includes an N bits successive approximation register analog-to-digital converter (N bits SAR ADC) and an estimation circuit. The N bits SAR ADC is configured to carry out a regular operation at least N times and an additional operation at least X time(s) in one cycle of conversion time, in which the N is an integer greater than 1 and the X is an integer not less than zero. The estimation circuit is configured to generate a test value according to total times the N bits SAR ADC carrying out the additional operation in Y cycles of the conversion time, in which the Y is a positive integer and the test value is related to the bit error rate of the N bits SAR ADC.

18 Claims, 6 Drawing Sheets

(58) Field of Classification Search
USPC .................................................. 341/120–155
See application file for complete search history.

(56) References Cited

U.S. PATENT DOCUMENTS

| | | | | |
|---|---|---|---|---|
| 8,922,405 | B2 | 12/2014 | Lin et al. | |
| 9,225,504 | B2* | 12/2015 | Wu | ........................ H04L 7/0079 |
| 9,407,277 | B2* | 8/2016 | Huang | .................. H03M 1/002 |
| 9,923,568 | B2 | 3/2018 | Kinyua | |
| 9,985,657 | B2* | 5/2018 | Shieh | ................ H03M 13/2906 |
| 10,284,219 | B2* | 5/2019 | Soundararajan | ..... H03K 5/2481 |
| 2005/0219107 | A1* | 10/2005 | Guidry | ................ H03M 1/1285 |
| | | | | 341/163 |

OTHER PUBLICATIONS

Allen Waters et al., "Analysis of Metastability Errors in Asynchronous SAR ADCs", 978-1-5090-0246-7/15/$31.00 © 2015 IEEE.
Akira Shikata et al., "A 0.5 V 1.1 MS/sec 6.3 fJ/Conversion-Step SAR-ADC With Tri-Level Comparator in 40 nm CMOS", IEEE Journal of Solid-State Circuits, vol. 47, No. 4, Apr. 2012.
Chun-Cheng Liu et al., "A 10-bit 50-MS/s SAR ADC with a Monotonic Capacitor Switching Procedure", IEEE Journal of Solid-State Circuits, vol. 45, No. 4, Apr. 2010.

* cited by examiner

1

BIT ERROR RATE FORECAST CIRCUIT FOR SUCCESSIVE APPROXIMATION REGISTER ANALOG-TO-DIGITAL CONVERSION

BACKGROUND OF THE INVENTION

1. Field of the Invention

The present invention relates to a bit error rate forecast circuit, especially to a bit error rate forecast circuit for successive approximation register analog-to-digital conversion.

2. Description of Related Art

In order to ensure that the performance of an integrated circuit (e.g., an integrated circuit including an analog-to-digital converter (ADC)) meets requirements, the integrated circuit should be tested so as to allow a tester to find out whether the integrated circuit fulfills one or more performance requirement(s) (e.g., requirements about a bit error rate (BER)). However, as the performance requirements of some circuits (e.g., vehicle electronic circuits or Ethernet circuits) in this industrial field are raised, the time for testing this kind of circuits gets longer and longer. For instance, if a tester is going to find out whether the bit error rate of an ADC of a gigabit Ethernet circuit is lower than $1/10^{15}$, the tester should verify that the ADC of the gigabit Ethernet circuit can successfully convert an analog input signal (e.g., a time-dependent voltage signal) that are successively received at $10^{15}$ time points while no metastability error occurs; therefore, provided the operation frequency of the ADC of the gigabit Ethernet circuit is 0.8 GHz, the tester will need $(10^{15}/0.8 \text{ GHz}) = 1250000$ seconds=14.47 days to finish testing the ADC. Such long time is not cost-effective in this industrial field.

SUMMARY OF THE INVENTION

An object of the present invention is to provide a bit error rate forecast circuit for successive approximation analog-to-digital conversion so as to resolve the problems of the current arts.

The present invention discloses a bit error rate (BER) forecast circuit for successive approximation register analog-to-digital conversion. An embodiment of the BER forecast circuit includes an N bits successive approximation register analog-to-digital converter (N bits SAR ADC) and an estimation circuit. The N bits SAR ADC is configured to carry out a regular operation at least N times and an additional operation at least X time(s) in one cycle of conversion time, in which the N is an integer greater than one, the X is an integer not less than zero, and if in one cycle of the conversion time the N bits SAR ADC carries out the regulation operation fixed times (e.g., N times) and the X is larger, it implies that the N bits SAR ADC consumes shorter time to finish the regulation operation and has longer time to execute the additional operation. The estimation circuit is configured to generate a test value according to total times that the N bits SAR ADC carries out the additional operation in Y cycles of the conversion time, in which the Y is a positive integer and the test value is related to a bit error rate of the N bits SAR ADC.

Another embodiment of the BER forecast circuit includes an SAR ADC and an estimation circuit. The SAR ADC is configured to carry out Y rounds of a regular operation, in which the Y is a positive integer greater than one and each of the Y rounds of the regular operation takes time less than conversion time. The estimation circuit is configured to generate a test value according to time differences between the conversion time and each operation time that the SAR ADC carries out each of the Y rounds of the regular operation, in which the test value is related to a bit error rate of the SAR ADC. It should be noted that the sooner a round of the regulation operation ends, the shorter the time that the SAR ADC consumes to finish this round of the regulation operation is, which implies that the SAR ADC has better performance and a lower bit error rate.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this industrial field. If any term is defined in the following description, such term should be explained accordingly.

A successive approximation register analog-to-digital converter (SAR ADC) (e.g., an asynchronous SAR ADC, ASAR ADC) requires operation time "t_req" to perform each round of a sampling-and-conversion operation on an analog input signal. The operation time t_req will vary with the amplitude of the analog input signal, the operation speed of the SAR ADC, etc. A circuit system including the SAR ADC will request the operation time t_req to be equal to or shorter than conversion time "t_conv" (e.g., predetermined fixed time) so as to ensure that the performance of the whole operation of the circuit system is acceptable. If the operation time t_req of some round of the sampling-and-conversion operation reaches the conversion time t_conv, the SAR ADC is found having a metastability error in this round of the sampling-and-conversion operation. Generally, for one round of the sampling-and-conversion operation, the lower the ratio of the operation time t_req to the conversion time t_conv (i.e., t_req/t_conv) is, the faster the SAR ADC finishes this round of the sampling-and-conversion operation, which implies better performance Performance can be evaluated by many indices, and one of the indices is bit error rate (BER). As a result, one can infer that the shorter the average of the operation time t_req of all rounds of the sampling-and-conversion operation is, the lower the bit error rate of the SAR ADC is. This inference is supported by the following literature: Allen Waters, Jason Muhlestein and Un-Ku Moon School of Electrical Engineering and Computer Science Oregon State University, Corvallis Oreg. Now with University of Washington, Seattle Wash., "*Analysis of Metastability Errors in Asynchronous SAR ADCs*", IEEE paper, 2015.

Figure 1:
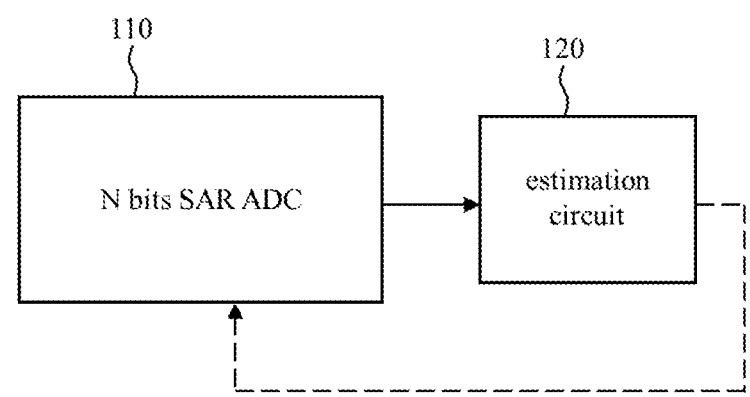
FIG. 1 shows the BER forecast circuit for SAR analog-to-digital conversion according to an embodiment of the present invention.

Based on the above inference, the present invention discloses a BER forecast circuit for successive approximation register analog-to-digital conversion. The BER forecast circuit is capable of forecasting the bit error rate of an SAR ADC according to a time difference between operation time t_req of the SAR ADC and conversion time t_conv (e.g., predetermined fixed time) of the SAR ADC. FIG. 1 shows an embodiment of the BER forecast circuit of the present invention. As shown in FIG. 1, the BER forecast circuit 100 includes an N bits SAR ADC 110 and an estimation circuit 120. The N bits SAR ADC 110 is configured to carry out a regular operation K times (i.e., at least N times such as N times or (N+$R_1$) times, in which N is an integer greater than one and $R_1$ time(s) is/are redundant time(s) while $R_1$ is determined by an implementor in light of her/his design/demand) and an additional operation at least X times (i.e., X times or (X+$R_2$) times, in which $R_2$ time(s) is/are redundant time(s) while $R_2$ is determined by an implementor in light of her/his design/demand) in one cycle of the conversion time t_conv (i.e., 1×t_conv) so as to generate N bits and X bit(s) respectively, in which the N is an integer greater than one, the K is an integer not less than the N and the X is an integer not less than zero. If a number of the time(s) that the additional operation is carried out is relatively larger, it implies that the N bits SAR ADC 110 consumes shorter time to carry out the regular operation K times and has longer time to carry out the additional operation. The estimation circuit 120 is configured to generate a test value according to the total times (i.e., $\Sigma_{i=1}^{Y} X_i$, in which the variable i stands for the $i^{th}$ cycle of the Y cycles of the conversion time, $X_i$ stands for the time(s) that the additional operation is carried out in the $i^{th}$ cycle of the Y cycles of the conversion time) that the N bits SAR ADC carries out the additional operation in Y cycles of the conversion time (i.e., Y×t_conv), in which the Y is a positive integer (e.g., Y≥10 or 10≤Y≤$10^{16}$). The test value is related to the bit error rate of the N bits SAR ADC; for instance, the test value is inversely proportional to the bit error rate of the N bits SAR ADC.

Figure 2:
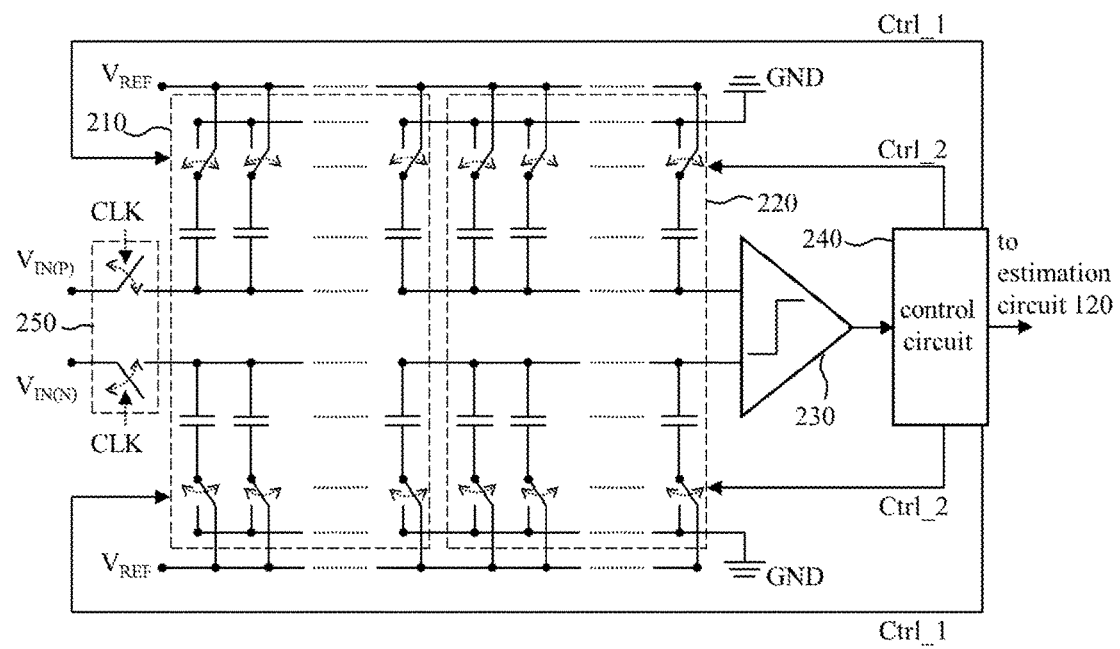
FIG. 2 shows an embodiment of the N bits SAR ADC of FIG. 1.

FIG. 2 shows an embodiment of the N bits SAR ADC 110 of FIG. 1.

Although the embodiment of FIG. 2 is applicable to an application of differential input, people of ordinary skill in the art can appreciate that the present invention with proper modifications (e.g., a positive input signal $V_{IN(P)}$ of a differential signal is replaced by a single-ended input signal and a negative input signal $V_{IN(N)}$ of the differential signal is replaced by a reference signal) is applicable to an application of single-end input. As shown in FIG. 2, the N bits SAR ADC 110 includes a first capacitor-and-switch circuit 210, a second capacitor-and-switch circuit 220, a comparing circuit 230, a control circuit 240 and a sampling-control switch circuit 250. The first capacitor-and-switch circuit 210 is configured to carry out a regular sampling operation of the regular operation according to a first switch control signal Ctrl_1 and a plurality of reference voltages (e.g., a positive reference voltage $V_{REF}$ and a ground voltage) and thereby generate at least N sampling results. The second capacitor-and-switch circuit 220 is configured to carry out an additional sampling operation of the additional operation according to a second switch control signal Ctrl_2 and a plurality of reference voltages (e.g., the positive reference voltage $V_{REF}$ and the ground voltage) and thereby generate at least X sampling result(s). The comparing circuit 230 is configured to carry out a regular comparison operation of the regular operation according to the at least N sampling results and thereby generate at least N comparison results, and the comparing circuit 230 is further configured to carry out an additional comparison operation of the additional operation according to the at least X sampling result(s) and thereby generate at least X comparison result(s). The control circuit 240 is configured to generate the aforementioned N bits and the first switch control signal Ctrl_1 according to the at least N comparison results and configured to generate the aforementioned X bits and the second switch control signal Ctrl_2 according to the at least X comparison result(s) and the conversion time. The sampling-control switch circuit 250 is configured to control the time for the N bits SAR ADC 110 performing an analog-to-digital conversion operation on an input signal ($V_{IN(P)}$, $V_{IN(N)}$) according to a sampling-control signal CLK (e.g., clock signal). In detail, the rising edge of the CLK has the control circuit 240 stop the analog-to-digital conversion operation of the N bits SAR ADC 110 and start the sampling operation of the N bits SAR ADC 110, and the falling edge of the CLK has the control circuit 240 start the analog-to-digital conversion operation of the N bits SAR ADC 110 and stop the sampling operation of the N bits SAR ADC 110. At the transient of the rising edge of the CLK, it is uncertain whether the analog-to-digital conversion operation is finished because the rising edge usually forces the N bits SAR ADC 110 to stop the analog-to-digital conversion operation.

The configuration and operation of the N bits SAR ADC 110 is similar to the configuration and operation of a conventional SAR ADC. More specifically, the first capacitor-and-switch circuit 210, the comparing circuit 230, the control circuit 240 and the sampling-control switch circuit 250 are similar or identical to a conventional SAR ADC capacitor-and-switch circuit, a conventional SAR ADC comparing circuit, a conventional SAR ADC control circuit and a conventional SAR ADC sampling-control switch circuit respectively. What is different from a conventional SAR ADC is that the N bits SAR ADC 110 further carries out the aforementioned additional operation and records the time(s) that the additional operation is carried out; consequently, the N bits SAR ADC 110 requires circuits (i.e., the second capacitor-and-switch circuit 220) and operation (i.e., operation for generating the at least X sampling result(s), operation for generating the at least X comparison result(s) and operation for generating the second switch control signal Ctrl_2) for realizing the additional operation. An exemplary conventional SAR ADC is found in the following literature: Chun-Cheng Liu, Soon-Jyh Chang, Guan-Ying Huang, and Ying-Zu Lin, "*A 10-bit 50-MS/s SAR ADC With a Monotonic Capacitor Switching Procedure*", IEEE JOURNAL OF SOLID-STATE CIRCUITS, VOL. 45, NO. 4, APRIL 2010 (hereafter "literature-1").

Please refer to FIG. 2. The first capacitor-and-switch circuit 210 includes N capacitor-and-switch sets and the second capacitor-and-switch circuit 220 includes M capacitor-and-switch set(s), in which the M is a positive integer (e.g., 2≤M≤6) and the aforementioned X is not greater than the M. During the first capacitor-and-switch circuit 210 executing the regular sampling operation, the second capacitor-and-switch circuit 220 is optionally connected to or disconnected from the first capacitor-and-switch circuit 210 by a switch (not shown in FIG. 2) so as to optionally participate in the charge-redistribution operation of the regular sampling operation or stand aside. In addition, the capacitance of each capacitor (e.g., 1C) of the M capacitorand-switch set(s) is equal to or dependent on the capacitance of the minimum physical capacitor among the capacitor array (e.g., 512C, 256C, . . . , 4C, 2C, 1C) of the first capacitor-and-switch circuit 210 and the capacitor array (e.g., 1C, 1C, . . . , 1C, 1C) of the second capacitor-and-switch circuit 220. However, this capacitance design is not a restriction on the implementation of the present invention; in other words, as long as the N bits SAR ADC 100 can normally generate the aforementioned N bits, people who carries out the present invention is free to determine the capacitance of each capacitor of the M capacitor-and-switch set(s).

Figure 3:
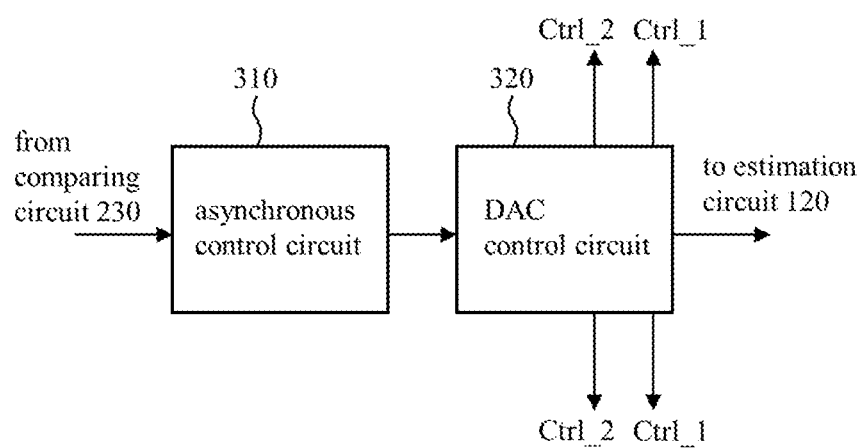
FIG. 3 shows an embodiment of the control circuit of FIG. 2.
Figure 4:
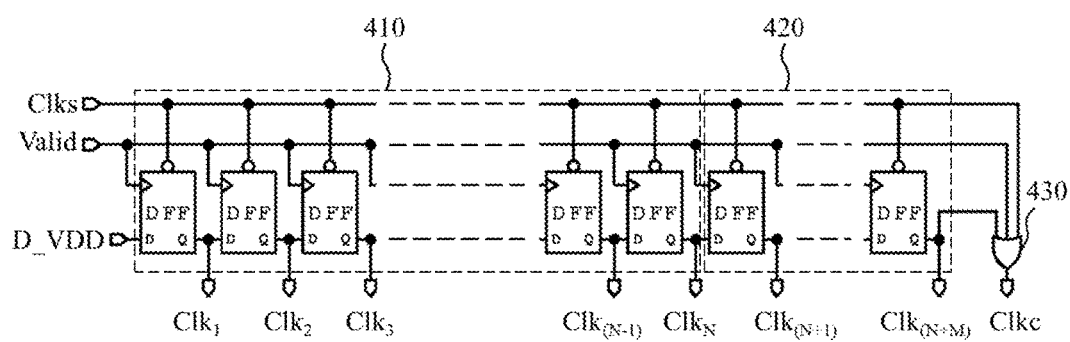
FIG. 4 shows an embodiment of the asynchronous control circuit of FIG. 3.
Figure 5:
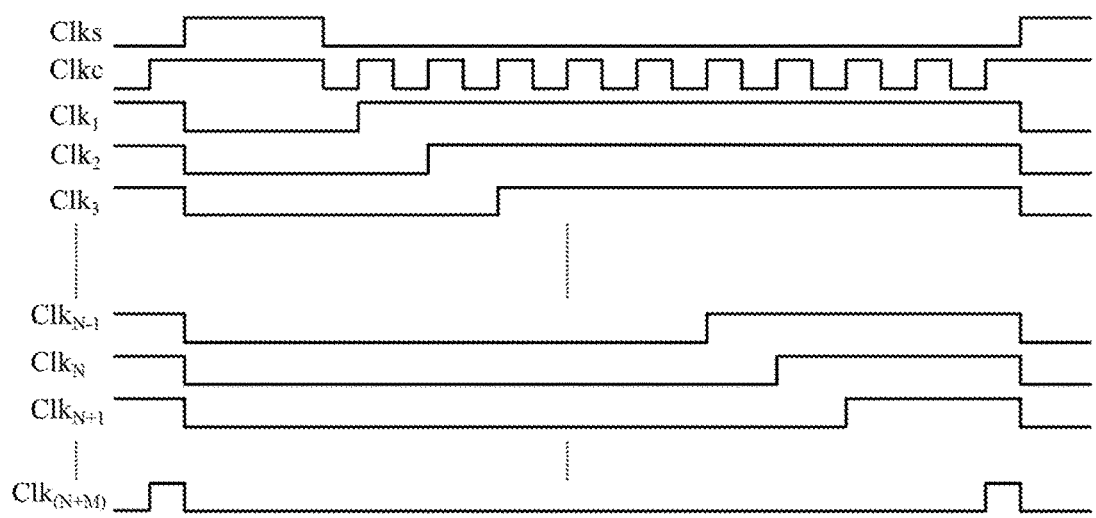
FIG. 5 shows a timing diagram of the signals and clocks of FIG. 4.

FIG. 3 shows an embodiment of the control circuit 240. As shown in FIG. 3, the control circuit 240 includes an asynchronous control circuit 310 and a digital-to-analog conversion (DAC) control circuit 320. As shown in FIG. 4, an embodiment of the asynchronous control circuit 310 includes N D-type flip-flops (DFFs) 410, M DFF(s) 420 and an OR gate 430 that are configured to successively generate (N+X) clocks (e.g., (N+M) clocks) and a signal Clkc according to signals Clks, Valid and D_VDD, in which the definitions of the N, the M and the X (X≤M) is found in the preceding paragraphs. The timing diagram of the Clks, the Clkc and the (N+X) clocks (e.g., $Clk_1$, $Clk_2$, $Clk_3$, $Clk_{N-1}$, $Clk_N$, $Clk_{N+1}$, . . . , $Clk_{(N+M)}$) is shown in FIG. 5. The level of the signal Valid is changing as the comparing circuit 230 is generating a comparison result and the signal D_VDD is a supply voltage. The DAC control circuit 320 is configured to successively generate the aforementioned N bits and the aforementioned first switch control signal Ctrl_1 according to the aforementioned N comparison results and the N clocks generated by the N DFFs 410; the DAC control circuit 320 is further configured to successively generate the aforementioned X bit(s) and the aforementioned second switch control signal Ctrl_2 according to the conversion time, the X comparison result(s) and the X clock(s) generated by X DFF(s) of the M DFFs 420, in which the X will approximate the M if the N bits SAR ADC has more time to carry out the additional operation. It should be noted that those of ordinary skill in the art can appreciate the detail of the asynchronous control circuit 310 by referring to known arts (e.g., the circuit of FIG. 9 of the aforementioned literature-1 and the description thereof); besides, the DAC control circuit 320 can be realized by known arts (e.g., the circuit of FIG. 10 of literature-1 and the description thereof).

Please refer to FIG. 1. In an exemplary implementation, the estimation circuit 120 is a digital circuit. In an exemplary implementation, the estimation circuit 120 adds up the times that the N bits SAR ADC 110 carries out the additional operation in the Y cycles of the conversion time respectively (e.g., the times equal to the amount of bits that the N bits SAR ADC 110 generates by executing the additional operation in the Y cycles of the conversion time respectively) so as to generate a sum (i.e., the aforementioned total times), and then the estimation circuit 120 divides the sum by the Y to generate the test value. In an exemplary implementation, the Y is fixed and the estimation circuit 120 adds up the times that the N bits SAR ADC 110 carries out the additional operation in the Y cycles of the conversion time respectively so as to generate a sum (i.e., the aforementioned total times), and then the estimation circuit 120 treats the sum as the test value without doing division. In an exemplary implementation, the estimation circuit 120 forecasts the bit error rate of the N bits SAR ADC 110 according to the test value and at least one reference value which is related to at least one predetermined bit error rate. For instance, after executing a test for a long time, it is found that an SAR ADC is capable of converting an analog input signal successively received at $10^{15}$ time points (i.e., capable of executing $10^{15}$ rounds of an analog-to-digital conversion operation) and no metastability error occurs (i.e., the bit error rate of this SAR ADC is less than $1/10^{15}$) so that the requirements of a specification are fulfilled; under the same test, if the test value obtained based on the SAR ADC converting the analog input signal successively received at 1000 time points (i.e., Y=1000) is 4.3, this test value 4.3 can be treated as a reference value; afterward the estimation circuit 120 can find out the relation between a test value obtained based on another similar/identical SAR ADC converting the analog input signal successively received at 1000 time points and the reference value 4.3 in a predetermined manner (e.g., look-up table) so as to determine whether the bit error rate of the similar/identical SAR ADC is less than $1/10^{15}$, and if the test value of the similar/identical SAR ADC is less or far less than the reference value 4.3, one can infer that the similar/identical SAR ADC will have one or more metastability error(s) during the similar/identical SAR ADC converting the analog input signal successively received at $10^{15}$ time points (i.e., the bit error rate of the similar/identical SAR ADC is greater than $1/10^{15}$) and won't fulfill the requirements of the specification. Since the time for an SAR ADC converting an analog input signal received at 1000 time points is far less than the time for the SAR ADC converting the analog input signal received at $10^{15}$ time points, the present invention saves testers a lot of test time. In an exemplary implementation, the estimation circuit 120 establishes and/or utilizes a transfer function between the bit error rate of an SAR ADC and the test value of the SAR ADC in light of a pre-obtained test result and/or a theory and thereby uses the transfer function to derive the bit error rate of the SAR ADC from the test value of the SAR ADC. In an exemplary implementation, the estimation circuit 120 adjusts the operation speed of the N bits SAR ADC 110 (as indicated by the dashed line in FIG. 1) according to the estimated bit error rate of the N bits SAR ADC 110; for instance, the estimation circuit 120 adjusts the operation voltage of the N bits SAR ADC 110 to achieve the adjustment of the operation speed of the N bits SAR ADC 110. The techniques about the above adjustment is found in Applicant's US patent (U.S. Pat. No. 8,922,405).

Figure 6:
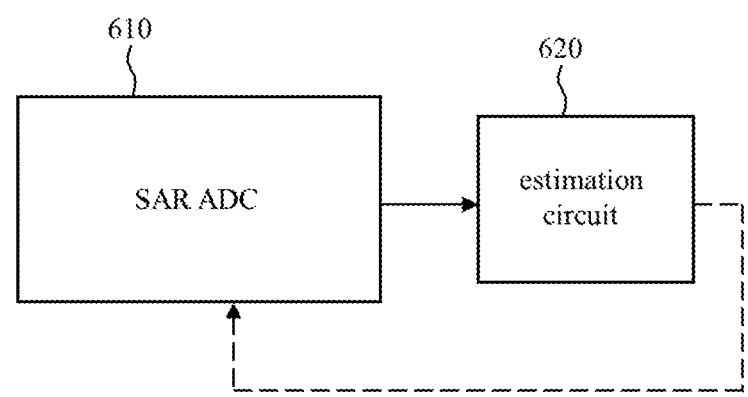
FIG. 6 shows the BER forecast circuit for SAR analog-to-digital conversion according to another embodiment of the present invention.

FIG. 6 shows another embodiment of the BER forecast circuit of the present invention. As shown in FIG. 6, the BER forecast circuit 600 includes an SAR ADC 610 and an estimation circuit 620. In an exemplary implementation, the operation of the BER forecast circuit 600 is the same as that of the BER forecast circuit 100 of FIG. 1; in another exemplary implementation, the SAR ADC 610 merely carries out a general SAR analog-to-digital conversion operation while the forecast of bit error rate is carried out by the estimation circuit 620. The SAR ADC 610 is identical or equivalent to the SAR ADC 110 of FIG. 1, and capable of executing the aforementioned additional operation; or the SAR ADC 610 is a conventional SAR ADC incapable of executing the additional operation. The SAR ADC 610 is configured to carry out Y rounds of a regulation operation, in which the Y is a positive integer and each of the Y rounds of the regular operation takes time less than conversion time (e.g., the aforementioned conversion time t_conv). The estimation circuit 620 is identical or equivalent to the estimation circuit 120 of FIG. 1, or the estimation circuit 620 is the estimation circuit as described in the following paragraph. The estimation circuit 620 is configured to generate a test value according to a time difference (which can be determined by the total times of the additional operation being carried out or determined by a time interval (e.g., the counts of a counter)) between the time "t_op" that each of the Y rounds of the regular operation consumes and the conversion time (i.e., the time interval=the conversion time–t_op), in which the test value is related to the bit error rate of the SAR ADC 610. It should be noted that the sooner a round of the regular operation ends, the shorter the time that the SAR ADC 610 consumes to finish this round of the regular operation is, which implies better performance.

Please refer to FIG. 6. The SAR ADC 610 starts and stops each of the Y rounds of the regular operation according to the level transition of at least one clock signal (while a related art is the FIGS. 9-10 of the aforementioned literature-1 and the description thereof); accordingly, even though the SAR ADC 610 does not carry out the additional operation, the estimation circuit 620 is still capable of calculating the time that each of the Y rounds of the regular operation consumes (i.e., the SAR ADC 610 informing the estimation circuit 620 of the time that each of the Y rounds of the regular operation consumes) and thereby the estimation circuit 620 is capable of calculating the time differences between the time that each of the Y rounds of the regular operation consumes and the conversion time (e.g., a predetermined fixed time). In an exemplary implementation, the estimation circuit 620 generate a calculation value (e.g., the sum of Y time differences) according to the above-mentioned time differences, and then the estimation circuit 620 generates the test value according to the calculation value and the Y (e.g., test value=(calculation value)/Y) or the estimation circuit 620 generates the test value according to the calculation value without the Y (e.g., test value=calculation value), in which the test value is related to the bit error rate of the SAR ADC 610. For instance, the test value is inversely proportionally to the bit error rate of the SAR ADC 610.

Since people of ordinary skill in the art can appreciate the detail and the modification of the embodiment of FIG. 6 by referring to the disclosure of the embodiments of FIGS. 1-5, which means that each feature of the embodiments of FIGS. 1-5 could be applicable to the embodiment of FIG. 6 in a reasonable way, repeated and redundant description is omitted here.

It should be noted that the way to carry out the present invention can be flexible. More specifically, if an implementation derived from the present invention is practicable, people of ordinary skill in the art can selectively make use of some or all of the features of any of the aforementioned embodiments or make use of some or all of the features of several of the embodiments to have the implementation come true.

To sum up, the BER forecast circuit for SAR analog-to-digital conversion of the present invention is capable of generating a test value related to the bit error rate of an SAR ADC according to the time difference between the time that the SAR ADC carries out a regular operation and conversion time, and the BER forecast circuit is further capable of estimating the bit error rate of the SAR ADC according to the relation between the test value and a pre-obtained reference value related to a certain bit error rate. As a result, the present invention can save this industrial a lot of test time.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A bit error rate (BER) forecast circuit for successive approximation register analog-to-digital conversion, comprising:
    an N bits successive approximation register analog-to-digital converter (N bits SAR ADC) configured to carry out a regular operation at least N times and an additional operation at least X time(s) in one cycle of conversion time, in which the N is an integer greater than one and the X is an integer not less than zero; and
    an estimation circuit configured to generate a test value according to total times that the N bits SAR ADC carries out the additional operation in Y cycles of the conversion time, in which the Y is a positive integer and the test value is related to a bit error rate of the N bits SAR ADC.

2. The BER forecast circuit for successive approximation register analog-to-digital conversion of claim 1, wherein the Y is greater than ten.

3. The BER forecast circuit for successive approximation register analog-to-digital conversion of claim 1, wherein the test value is inversely proportional to the bit error rate of the N bits SAR ADC.

4. The BER forecast circuit for successive approximation register analog-to-digital conversion of claim 1, wherein the N bits SAR ADC includes:
    a first capacitor-and-switch circuit configured to carry out a regular sampling operation of the regular operation according to a first switch control signal and thereby generate at least N sampling results;
    a second capacitor-and-switch circuit configured to carry out an additional sampling operation of the additional operation according to a second switch control signal and thereby generate at least X sampling result(s);
    a comparing circuit configured to carry out a regular comparison operation of the regular operation according to the at least N sampling results and thereby generate at least N comparison results, and the comparing circuit further configured to carry out an additional comparison operation of the additional operation according to the at least X sampling result(s) and thereby generate at least X comparison result(s); and
    a control circuit configured to generate the first switch control signal according to the at least N comparison results and generate the second switch control signal according to the at least X comparison result(s) and the conversion time.

5. The BER forecast circuit for successive approximation register analog-to-digital conversion of claim 4, wherein the second capacitor-and-switch circuit includes M capacitor-and-switch set(s), in which the M is a positive integer and the X is not greater than the M.

6. The BER forecast circuit for successive approximation register analog-to-digital conversion of claim 1, wherein the estimation circuit is a digital circuit.

7. The BER forecast circuit for successive approximation register analog-to-digital conversion of claim 1, wherein the estimation circuit adds up times that the N bits SAR ADC carries out the additional operation in the Y cycles of the conversion time respectively to obtain the total times, and then the estimation circuit divides the total times by the Y to obtain the test value.

8. The BER forecast circuit for successive approximation register analog-to-digital conversion of claim 1, wherein the estimation circuit adds up times that the N bits SAR ADC carries out the additional operation in the Y cycles of the conversion time respectively to obtain the total times and then treats the total times as the test value.

9. The BER forecast circuit for successive approximation register analog-to-digital conversion of claim 1, wherein the estimation circuit estimates the bit error rate of the N bits SAR ADC according to the test value and at least one reference value, in which the at least one reference value is related to at least one predetermined bit error rate.

10. The BER forecast circuit for successive approximation register analog-to-digital conversion of claim 9, wherein the estimation circuit carries out extrapolation calculation according to the test value and the at least one reference value and thereby estimates the bit error rate of the N bits SAR ADC.

11. The BER forecast circuit for successive approximation register analog-to-digital conversion of claim 9, wherein the estimation circuit adjusts an operation speed of the N bits SAR ADC according to the bit error rate of the N bits SAR ADC.

12. The BER forecast circuit for successive approximation register analog-to-digital conversion of claim 1, wherein the Y is greater than ten and the test value is treated as a reference value for another SAR ADC to estimate a bit error rate of the another SAR ADC.

13. A bit error rate (BER) forecast circuit for successive approximation register analog-to-digital conversion, comprising:
a successive approximation register analog-to-digital converter (SAR ADC) configured to carry out Y rounds of a regular operation, in which the Y is a positive integer greater than one and each of the Y rounds of the regular operation takes time less than conversion time; and
an estimation circuit configured to generate a test value according to time differences between the conversion time and each operation time that the SAR ADC carries out each of the Y rounds of the regular operation, in which the test value is related to a bit error rate of the SAR ADC.

14. The BER forecast circuit for successive approximation register analog-to-digital conversion of claim 13, wherein the estimation circuit generates a calculation value according to the time differences and then generates the test value according to the calculation value and the Y.

15. The BER forecast circuit for successive approximation register analog-to-digital conversion of claim 13, wherein the test value is inversely proportional to the bit error rate of the SAR ADC.

16. The BER forecast circuit for successive approximation register analog-to-digital conversion of claim 13, wherein the estimation circuit estimates the bit error rate of the SAR ADC according to the test value and at least one reference value, in which the at least one reference value is related to at least one predetermined bit error rate.

17. The BER forecast circuit for successive approximation register analog-to-digital conversion of claim 16, wherein the estimation circuit carries out extrapolation calculation according to the test value and the at least one reference value and thereby estimates the bit error rate of the N bits SAR ADC.

18. The BER forecast circuit for successive approximation register analog-to-digital conversion of claim 16, wherein the estimation circuit adjusts an operation speed of the SAR ADC according to the bit error rate of the SAR ADC.

* * * * *